United States Patent
Sievers et al.

(10) Patent No.: US 12,244,043 B2
(45) Date of Patent: Mar. 4, 2025

(54) METHOD AND DEVICE FOR FORMING A CATALYTICALLY-ACTIVE MEMBRANE OR A MEMBRANE-ELECTRODE-ASSEMBLY

(71) Applicant: LEIBNIZ-INSTITUT FÜR PLASMAFORSCHUNG UND TECHNOLOGIE E.V., Greifswald (DE)

(72) Inventors: Gustav Sievers, Greifswald (DE); Volker Brüser, Greifswald (DE); Pablo Collantes-Jiménez, Greifswald (DE); Kirsten Anklam, Greifswald (DE)

(73) Assignee: LEIBNIZ-INSTITUT FÜR PLASMAFORSCHUNG UND TECHNOLOGIE E.V., Greifswald (DE)

(*) Notice: Subject to any disclaimer, the term of this patent is extended or adjusted under 35 U.S.C. 154(b) by 0 days.

(21) Appl. No.: 18/495,800

(22) Filed: Oct. 27, 2023

(65) Prior Publication Data

US 2024/0055637 A1    Feb. 15, 2024

Related U.S. Application Data

(63) Continuation of application No. PCT/EP2022/082349, filed on Nov. 17, 2022.

(30) Foreign Application Priority Data

Nov. 17, 2021    (EP) .................................... 21208765

(51) Int. Cl.
   *H01M 8/1004*    (2016.01)
   *C23C 14/35*     (2006.01)
   (Continued)

(52) U.S. Cl.
   CPC ........... *H01M 8/1004* (2013.01); *C23C 14/35* (2013.01); *C25B 9/23* (2021.01); *C25B 11/031* (2021.01);
   (Continued)

(58) Field of Classification Search
   None
   See application file for complete search history.

(56) References Cited

U.S. PATENT DOCUMENTS

| 2014/0186744 | A1  | 7/2014 | Franco |
| 2018/0145339 | A1  | 5/2018 | Xu |
| 2019/0071786 | A1* | 3/2019 | Jang .......................... C25B 9/19 |

FOREIGN PATENT DOCUMENTS

| JP | 2003-068309         | *   | 3/2003 |
| WO | 2020121079          |     | 6/2020 |
| WO | WO-2022038540 A1    | *   | 2/2022 |

* cited by examiner

*Primary Examiner* — Jonathan Crepeau
(74) *Attorney, Agent, or Firm* — JMB Davis Ben-David

(57) ABSTRACT

Described herein is a method for manufacturing a catalytically-active membrane-electrode-assembly (20) with one or more, particularly two electrodes, the method comprising at least the steps of: i) depositing a heterogenous layer (3) on a substrate (5), the heterogeneous layer (3) comprising a base metal (1) and a noble metal (2) heterogeneously distributed in the heterogenous layer (3), ii) leaching of the base metal (1) out of the heterogeneous layer (3), such that a first self-supporting nanoporous catalyst layer (4) comprising the noble metal (2) is formed on the substrate (5), iii) adding of at least one kind of proton-conductive ionomers (40) and/or at least one kind of hydrophobic particles (41) and/or an ionic liquid (42) to the first self-supporting nanoporous catalyst layer (4), and iv) forming a catalytically-active membrane-electrode-assembly (20) by attaching the self-supporting nanoporous catalyst layer (4) to a first side of (Continued)

a membrane (10), such that a catalytically-active membrane-electrode-assembly (20) with one electrode is formed.

8 Claims, 7 Drawing Sheets

(51) Int. Cl.
    *C25B 9/23*       (2021.01)
    *C25B 11/031*    (2021.01)
    *C25B 11/053*    (2021.01)
    *C25D 3/50*       (2006.01)
    *H01M 4/86*      (2006.01)
    *H01M 4/88*      (2006.01)
    *H01M 4/92*      (2006.01)
    *H01M 4/96*      (2006.01)

(52) U.S. Cl.
    CPC .............. *C25B 11/053* (2021.01); *C25D 3/50* (2013.01); *H01M 4/8657* (2013.01); *H01M 4/881* (2013.01); *H01M 4/8871* (2013.01); *H01M 4/8892* (2013.01); *H01M 4/8896* (2013.01); *H01M 4/92* (2013.01); *H01M 4/926* (2013.01); *H01M 4/96* (2013.01)

METHOD AND DEVICE FOR FORMING A CATALYTICALLY-ACTIVE MEMBRANE OR A MEMBRANE-ELECTRODE-ASSEMBLY

CROSS-REFERENCE TO RELATED APPLICATIONS

This is a continuation of International Patent Application No. PCT/EP2022/082349, filed on Nov. 17, 2022, which claims the benefit of European Patent Application 21208765.4, filed on Nov. 17, 2021. The contents of the foregoing patent applications are incorporated by reference herein in their entirety.

FIELD

The present invention relates to a method for forming a catalytically-active membrane or a membrane-electrode-assembly. The invention further relates to a membrane-electrode-assembly.

BACKGROUND

The invention teaches a method for manufacturing a catalytically-active membrane, electrode or membrane-electrode-assembly for proton exchange membrane (PEM) fuel cells and electrolyzers (also referred to in the art as electrolytic cells). These types of fuel cells and electrolyzers have the advantage to achieve high current densities and are very flexible with regard to a fluctuating demand or supply. In detail, the core of fuel cells and electrolyzers is the membrane-electrode-assembly. The membrane-electrode-assembly consists of a catalytically-active membrane and a gas-permeable electrode or a catalytically-active electrode and membrane. Particularly for PEM electrolyzers, a membrane-electrode-assembly comprising a membrane sandwiched between two electrodes, the anode and the cathode, are commonly used, wherein the electrodes and/or the membrane are catalytically-active. For the anode in PEM electrolyzers, oxides containing precious metals are usually required, such as iridium oxide, ruthenium oxide. Platinum is the material of choice for the cathode in PEM electrolyzers due to the demanding reaction conditions. However, also other catalysts like MoS or other non-precious metal catalysts can be used for the cathode. For PEM Fuel cells in turn, the hydrogen oxidation reaction (HOR) at the anode is relatively active. Therefore, platinum can be used in low loading as the most common catalyst used at the anode. Conversely, the oxygen reduction reaction (ORR), which takes place at the cathode, demands high loadings of platinum as well to maximize the surface area for the reaction and to achieve maximum activity.

For a high efficiency of the catalysts, it is necessary to achieve a high surface-to-volume-ratio. To achieve this, nanoparticles of the catalyst are normally used, which are applied to the electrode or to the membrane in the form of a suspension using a spray process.

Based on this, it is subject of the present invention to provide a method for forming a catalytically-active membrane-electrode-assembly with one or more, particularly two electrodes, which is improved with respect to the prior art, particularly with respect to an enhanced surface-to-volume ratio of the catalyst.

SUMMARY

This object is solved by a the features of the described methods and membrane-electrode-assemblies.

Advantageous embodiments of the invention are given in the dependent claims and described in the following.

According to the invention and a first aspect thereof, a method for manufacturing a catalytically-active membrane-electrode-assembly with one or more, particularly two electrodes, comprises at least the steps of:

i) depositing a heterogeneous layer on a substrate, the heterogeneous layer comprising a base metal and a noble metal heterogeneously distributed in the heterogenous layer, ii) leaching of the base metal out of the heterogeneous layer, such that a first self-supporting nanoporous catalyst layer comprising the noble metal is formed on the substrate, iii) adding of at least one kind of proton-conductive ionomers and/or at least one kind of hydrophobic particles and/or an ionic liquid to the first self-supporting nanoporous catalyst layer, and iv) forming a catalytically-active membrane-electrode-assembly by attaching the self-supporting nanoporous catalyst layer to a first side of a membrane, such that a catalytically-active membrane-electrode-assembly with one electrode is formed.

As such, the method according to the invention describes a process in which not a nanoparticle but a nanoporous, self-supporting catalyst layer is produced. The self-supporting layer has a very high surface area compared to the volume. In addition, the layer is self-supporting and therefore, unlike nanoparticles, does not require any support structure or a scaffold which in turn confers a higher resistance to corrosive environments found in reaction in acidic media in which the membrane-electrode-assembly may be deployed.

The pores of the self-supporting nanoporous catalyst layer are preferably within the nanometer scale, for example having diameters in a range of 1 nm to 200 nm, more particularly in the range of 2 nm to 50 nm.

Preferably, the heterogeneous layer formed by the base metal (as its first component) and the noble metal (as its second component) is highly heterogeneous and does not show inter-alloying features, but comprises multiple base metal and noble metal particles arranged in a highly heterogeneous manner. The heterogeneity of the base and noble metal may be such that the base metal forms regions within the layer that in essence correspond to the pore size once the base metal is leached out of the layer.

Preferably, the steps i), ii), iii) and iv) are executed chronologically, i.e. one after another in the order stated above.

Execution of only the steps i) and ii) results in the formation of a catalytically-active electrode. By applying step iv), a catalytically-active electrode may be pressed together with a membrane, forming a catalytically-active membrane or a catalytically-active membrane assembly. The intermediate step iii) is particularly advantageous to establish a strong contact between the catalytically-active electrode and the membrane, leading to high surface-to-volume-ratios of the catalyst, i.e. the noble metal, substantially improving the efficiency of the catalyst. The intermediate step iii) advantageously contributes to maximize the three-phase boundary of the catalyst, which is in contact with the gas-, liquid- and solid phase, when the membrane-electrode-assembly is put to work. Therefore, to move the protons to the catalyst, a proton conductor is needed, which may be realized by the proton-conductive ionomer, or the ionic liquid. Hydrophobic materials are needed to remove the water, for example using the ionic liquid or hydrophobic particles. Accordingly, the liquids may be both—hydrophobic and ionic conductive.

Particularly, the term 'base metal" may also include a base metal compound or a base metal alloy, having at least one base metal as the predominant component.

Particularly, the term "noble metal" may also include a noble metal compound or a noble metal alloy having at least one noble metal as the predominant component.

When in use for example in a fuel cell in an electrolyzer, two (or more) catalytically-active electrodes need to be electrically insulated from each other. To this end, the two (or more) catalytically-active electrodes are preferably separated and electrically insulated from each other by the membrane. Therefore, according to an embodiment of the present invention, a second self-supporting nanoporous catalyst layer on the substrate may be formed according to step ii) and iii), e.g. either simultaneously with or sequentially to the first self-supporting nanoporous catalyst layer, or by separating a portion of the first self-supporting nanoporous catalyst layer that forms the second self-supporting nanoporous catalyst layer. In step iv) or in a subsequent step, the second self-supporting nanoporous catalyst layer may be attached to a second side of the membrane, such that a catalytically-active membrane-electrode-assembly with two electrodes is formed.

According to an embodiment of the present invention, attaching the first and/or the second self-supporting nanoporous catalyst layer to the membrane is carried out by pressing and/or by decal transferring the first and/or second self-supporting nanoporous catalyst layer from the substrate to the membrane. Referring to the decal transfer, the substrate preferably forms the decal and the first and/or second self-supporting nanoporous catalyst layer forms the pattern to be transferred to the membrane by means of the decal transfer.

To achieve best contact between the electrode and the membrane, the pressing temperature needs to approach the glass transition temperature of the membrane to create adhesion with the electrode but without damaging the membrane structure. To this end, the pressing and/or decal transferring may preferably be done at a pressure between 1 bar and 75 bar and/or at a substrate temperature within 115° C. and 145° C., particularly for a time between 15 seconds and 600 seconds.

According to an embodiment of the present invention, the at least one kind of proton-conductive ionomer and/or the at least one kind of hydrophobic particles and/or the ionic liquid may be added to the first and/or second self-supporting nanoporous catalyst layer by at least one of the following: spraying, ultrasonic spraying, decal-transferring, immersing, drop casting, filtering. This is particularly advantageous to achieve strong contact of the self-supporting nanoporous catalyst layer which is in three-phase contact with reactant, proton transport medium and product.

According to an embodiment of the present invention, the one kind of hydrophobic particles may be or comprise at least one of the following: Carbon, Nafion, Titanium Oxide and/or Teflon.

The term "Nafion" relates to a brand name for a sulfonated tetrafluoroethylene-based fluoropolymer-copolymer having the CAS number: 31175-20-9.

The term "Teflon" relates a synthetic fluoropolymer of tetrafluoroethylene having the CAS number: 9002-84-0.

According to an embodiment of the present invention, the substrate may comprise or be a gas-permeable electrode and/or a transfer substrate configured for decal transferring the first and/or second self-supporting nanoporous catalyst layer onto the membrane. For example, the gas-permeable electrode may comprise titanium, tantalum or carbon and the transfer substrate may comprise poly (4,4'-oxydiphenylene-pyromellitimide), polytetrafluorethen (CAS: 9002-84-0) or carbon. Particularly, the first and/or second self-supporting nanoporous catalyst layer may be in contact with the gas-permeable electrode or the transfer substrate via at least one of the two sides of the membrane. Optionally, the transfer substrate may be removed after pressing and/or decal transferring the first and/or second self-supporting nanoporous catalyst layer from the substrate to the membrane. The gas-permeable electrode may be pressed with the membrane.

According to an embodiment of the present invention, the base metal may for example comprise or be at least one of the following: Co, Cu, Fe, Ni, Zn, Al, Mg, Cr, Mo, Gd, Ta, Ti, W, Nb or Mn.

The noble metal may for example comprise or be at least one of the following: Pt, Ru, Ir, Au, iridium oxide, ruthenium oxide.

According to an embodiment of the present invention, the base metal and/or the noble metal may be deposited by a physical vapor deposition (PVD) method.

The PVD may for example include or be sputtering, particularly alternating magnetron sputtering.

According to an embodiment of the present invention, the PVD may be directed from a sputtering target comprising a rectangular target area to the substrate with a pressure between 2 Pa and 10 Pa, for example using a radio frequency (RF) or direct current (DC) plasma source.

According to an embodiment of the present invention, the substrate may be moved back and forth along at least one spatial direction during the PVD. The movement may correspond to an oscillation.

According to an embodiment of the present invention, the substrate with a lateral width L is moved by an offset of less at least L/4 relative to a resting point as it moves back and forth during the PVD along the at least one direction.

According to an embodiment of the present invention, during step i) the deposition of base metal and noble metal, particularly by PVD may be alternated at least 3 times, which advantageously contributes to obtain a highly heterogeneous layer comprising the base metal and the noble metal. The alternation may be understood such that the deposition of base metal and noble metal does not happen simultaneously, but sequentially.

According to another embodiment of the invention, the base metal forms regions in the layer that are comprised by the noble metal, particularly wherein said regions consist of the base metal only.

According to another embodiment of the invention, a size of said regions of the base metal is in range of 1 nm to 200 nm, particularly wherein the size may differ from region to region.

According to another embodiment of the invention, the noble metal forms a scaffold in the layer that comprises the base metal.

According to an embodiment of the present invention, a weight ratio between the deposited base metal and the deposited noble metal may be between 0.5:1 and 20:1, which results in the best catalyst performance.

According to an embodiment of the present invention, step ii) may be carried out in an electrolyte arranged between a first leaching electrode and a second leaching electrode, wherein the heterogeneous layer and the first leaching electrode are electrically connected and a leaching current is applied between the first and the second leaching electrode, such that the base metal is leached of the heterogenous layer. To this end, the heterogeneous layer on the substrate, particularly on the transfer substrate may particularly be arranged within the electrolyte or be immersed into the electrolyte.

According to an embodiment of the present invention, the electrical potential of the first leaching electrode may be controlled by a third leaching electrode, preferably by a third leaching electrode in close proximity to the first electrode. The third leaching electrode may be a platinum electrode in a hydrogen atmosphere, wherein the third leaching electrode serves as a reference electrode configured to control the electric potential of the first leaching electrode and to allow a measurement of a voltage between the first and the third leaching electrode. At the same time, an electric leaching current through the electrolyte may be applied between the first and the second leaching electrode to execute the leaching process, wherein the first leaching electrode is preferably connected to the heterogeneous layer. The leaching current between the first and the second leaching electrode may be controlled such that the measured voltage between the first and the third leaching electrode reaches a predetermined value, for example a voltage between −0.2 V and 1.5 V.

According to an embodiment of the present invention, the electrolyte may comprise an acid or a base, wherein the acid may for example comprise at least one of the following: $HClO_4$, $H_2SO_4$, $HNO_3$ and wherein the base may for example comprise at least one of the following: KOH or NaOH.

According to an embodiment of the present invention, the concentration of the acid or the base in the electrolyte may be within 0.1 mol/l to 8 mol/l.

According to an embodiment of the present invention, the potential of the first leaching electrode relative to the potential of the third leaching electrode may correspond to a voltage within −0.2 V and +1.5 V. The voltage and the resulting leaching current flowing particularly between the first and the second leaching electrode may be constant in time but it may also be alternating with time, particularly periodically with time.

According to an embodiment of the present invention, during step ii), the electrolyte (solution) may be at least partially exchanged with electrolyte (solution) that has not been used in step ii) and/or the electrolyte may be subjected to a flow, such that the electrolyte is constantly and particularly continuously exchanged. This is in particular advantageous to avoid cross-contamination of leached cations into the membrane, which is known to deteriorate the performance of the catalyst and inactivating the membrane, for example by exchanging the protons in the membrane with cations.

According to an embodiment of the present invention, particularly during step ii), the temperature of the electrolyte may be adjusted within a range from 10° C. to 95° C.

According to an embodiment of the present invention, step ii) may be carried out in a leaching chamber, wherein the leaching chamber comprises at least the first leaching electrode, the first leaching electrode being electrically connected, particularly short-connected with the heterogeneous layer, particularly the heterogeneous layer deposited on the substrate; the second leaching electrode; as well as the electrolyte arranged between the first and the second leaching electrode, wherein the heterogeneous layer is arranged between the first and the second leaching electrode. The leaching chamber may optionally further comprise the third leaching electrode.

According to an embodiment of the present invention, at least during step ii), a flow of at least one non-reactive (inert) gas, particularly $N_2$ and/or Ar may be conducted through the leaching chamber.

According to an embodiment of the present invention, at least during step ii), a flow of at least one reactive gas, particularly $H_2$ or $O_2$ may be conducted through the leaching chamber, particularly above an upside of the first leaching electrode facing away from the electrolyte.

According to an embodiment of the present invention, the transfer substrate may be detached from the catalytically-active membrane-electrode-assembly after attaching the first and/or second catalyst layer to the membrane.

According to a second aspect of the invention, a membrane-electrode-assembly for a proton exchange membrane (PEM) fuel cell or an electrolyzer comprising the following components is disclosed:
 a first gas-permeable electrode layer,
 a first self-supporting nanoporous catalyst layer comprising a noble metal,
 a membrane,
wherein the first self-supporting nanoporous catalyst layer extends between the first gas-permeable electrode layer and the membrane, characterized in that the first self-supporting nanoporous catalyst layer is formed by a plurality of grains of a first catalyst compound, wherein gaps are formed in between the grains such as to form an increased surface area of the first self-supporting nanoporous catalyst layer for enhancing catalytic reactions.

It is noted that definitions, features as well as embodiments relating to the method may apply identically or in an analogous manner to the second aspect of the invention, namely, the membrane-electrode assembly and vice versa.

In particular, a composition of the electrode and/or the catalyst as disclosed in conjunction with the method are optionally applicable as well to the membrane-electrode assembly.

Particularly, the first gas-permeable electrode may be formed as a layer. Similarly, the first self-supporting nanoporous catalyst may be formed as a layer as well.

It is noted that the term "layer" may include the notion of a non-continuous layer that comprises recesses and gaps and is not necessarily completely interconnected. Thus, a layer thickness may vary locally, but a person skilled in the art is able to associate a layer thickness, e.g. by determining an envelope of the layer.

The term 'increased surface area' particularly relates to an area that is greater than a surface area of a layer consisting in essence of two smooth surfaces of a continuous manifold. The gaps and the grain structure allow for such an increased surface area.

Due to the increased surface area, the invention according to the second aspect allows for the reduced use of the catalyst compound.

According to another embodiment of the invention, the membrane-electrode-assembly further comprises a second self-supporting nanoporous catalyst layer arranged on a second gas-permeable electrode layer on a side of the membrane facing away, i.e. in essentially the opposite direction from the first self-supporting nanoporous catalyst layer, such that the second self-supporting nanoporous catalyst layer extends between the second gas-permeable electrode layer and the membrane, wherein the second self-supporting nanoporous catalyst layer is formed by a plurality of grains comprising a second catalyst compound, wherein gaps are formed in between the grains such as to form an increased surface area of the second self-supporting nanoporous catalyst layer for enhancing catalytic reactions.

Particularly, the second gas-permeable electrode may be formed as a layer. Similarly, the second self-supporting nanoporous catalyst may be formed as a layer as well.

According to another embodiment of the invention, a median equivalent spherical diameter of the plurality of grains of the first and/or the second self-supporting nanoporous catalyst layer is in the range of 0.1 µm to 1.0 µm.

The equivalent spherical diameter is a measure of particle sizes known the skilled person.

While the grains may be at least partially interconnected, the skilled person, e.g. by means of a segmentation method, is able to estimate separated entities/grains from the interconnected grains for the purpose of estimating a size distribution, and thus an equivalent spherical diameter may be determined for the plurality of grains.

As the grains may be considered as particles as well, the equivalent spherical diameter may be applied to characterize a size distribution of the grains.

The advantage of this embodiment is that the size distribution allows for an extended surface area, particularly in case the gaps form a comparable volume in size.

According to another embodiment of the invention, the equivalent spherical diameter of the plurality of grains of the first and/or the second self-supporting nanoporous catalyst layer is in the range of 50 nm to 1.500 nm. This embodiment allows for an alternative or complementary measure of the size distribution that allows for an optimized surface area of the grains.

The term "nanoporous" particularly refers to structure of the grains, which is porous as well, such that a surface area of each grain is increased as compared to a corresponding sphere (with a smooth surface) of an equivalent diameter.

The nanoporous grains as well as the gaps in between said grains form the nanoporous electrode layer.

According to another embodiment of the invention, a ratio of a volume comprising the gaps to a volume comprising the grains of the first and/or the second self-supporting nanoporous catalyst layer is in the range of 0.3 to 5, particularly in the range of 0.5 to 3, more particularly in the range of 0.8 to 1.2.

This measure further elaborates on a structural feature of the catalyst layer(s) that allows for an enhanced surface area of the grains for catalytic activity.

In this regard the first and/or the second catalyst layer may be formed non-continuously. This in turn allows for a grain structure of the catalyst layer that provides an enhanced surface area as compared to a continuous catalyst layer that may only exhibit a surface facing toward the membrane and a surface facing toward the electrode layer, wherein a surface area of these surfaces would be smaller than a surface area of the disclosed granular structure.

According to another embodiment of the invention, the first catalyst compound comprises or is iridium.

According to another embodiment of the invention, the first gas-permeable electrode layer comprises or is titanium.

According to another embodiment of the invention, the second gas-permeable electrode layer comprises or is carbon.

According to another embodiment of the invention, the membrane is a proton-permeable membrane configured to retain at least hydrogen, oxygen.

According to another embodiment of the invention, the electrode-membrane-assembly is formed using the method according to the first aspect.

BRIEF DESCRIPTION OF THE DRAWINGS

Particularly, exemplary embodiments are described below in conjunction with the Figures. The Figures are appended to the claims and are accompanied by text explaining individual features of the shown embodiments and aspects of the present invention. Each individual feature shown in the Figures and/or mentioned in the text of the Figures may be incorporated (also in an isolated fashion) into a claim relating to the method according to the present invention.

DETAILED DESCRIPTION

Figure 1:
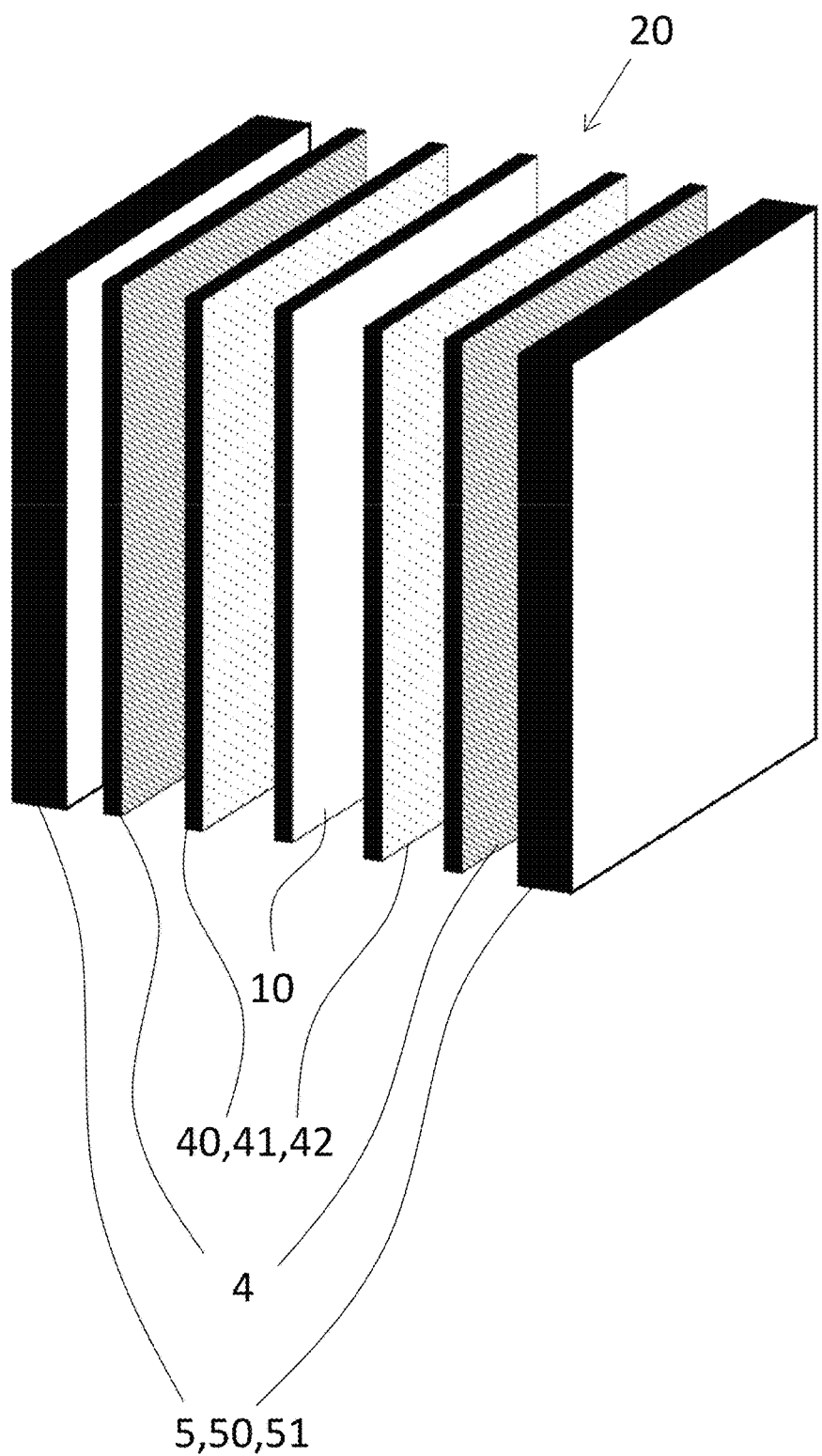
FIG. 1 shows a membrane-electrode-assembly formed by the method according to the invention.

FIG. 1 shows an exploded view of a membrane 10 sandwiched between two self-supporting nanoporous catalyst layers 4 comprising ionomers 40 and two gas-permeable electrodes 50, representing a membrane-electrode-assembly 20 that may be formed using the method according to the invention. The membrane-electrode-assembly 20 may particularly find application in PEM fuel cells and electrolyzers.

According to the method of the present invention, the self-supporting nanoporous catalyst layer 4 may be formed by in a first step depositing a heterogeneous layer 3 (not shown in FIG. 1) on a substrate 5, wherein the heterogeneous layer 3 preferably comprises a base metal 1 and a noble metal 2.

The base metal 1 may for example comprise or be at least one of the following: Co, Cu, Fe, Ni, Zn, Al, Mg, Cr, Mo, Gd, Ta, Ti, W, Nb or Mn.

The noble metal 2 may for example comprise or be at least one of the following: Pt, Ir, IrO2, Ru, RuO2, Au.

The substrate 5 may comprise or be a gas-permeable electrode 50, for example comprising titanium, tantalum or carbon. The substrate 5 may also comprise or be a transfer substrate 51, for example comprising Kapton, Teflon or carbon foil.

In a second step, the base metal 1 is preferably leached out of the heterogenous layer, such that a self-supporting nanoporous catalyst layer 4 comprising the noble metal 2 is formed on the substrate 5.

Figure 4:
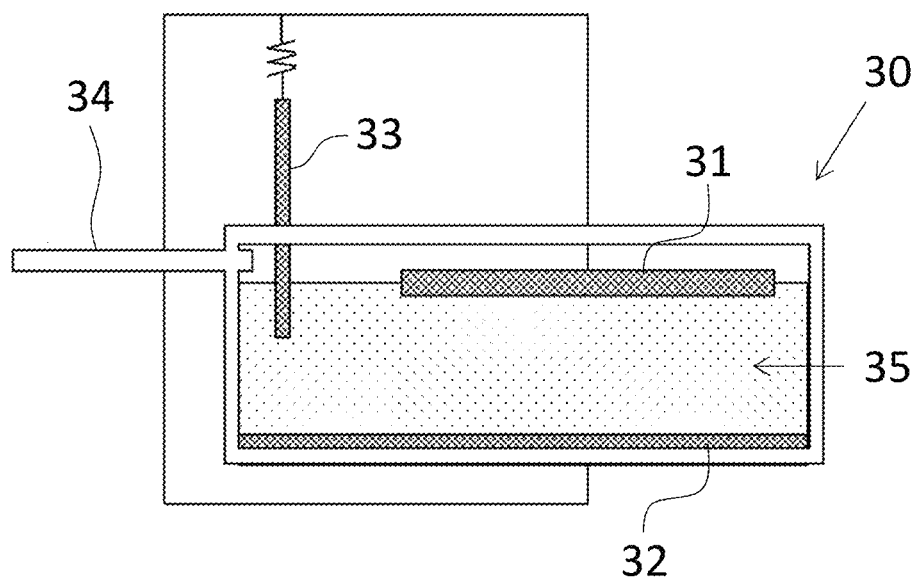
FIG. 4 shows an embodiment of the method according to the invention, wherein the base metal is leached out of the heterogeneous layer in a leaching chamber comprising an electrolyte and three leaching electrodes.

The leaching may for example be performed chemically or electrochemically, for example within a leaching chamber 30 comprising an electrolyte 35 as further explained in FIG. 4.

In a third step, at least one kind of proton-conductive ionomers 40 and/or at least one kind of hydrophobic particle 41 and/or an ionic liquid 42 is preferably added to the self-supporting nanoporous catalyst layer 4.

For example, the at least one kind of hydrophobic particles 41 may comprise or be one of the following: carbon, sulfonated tetrafluoroethylene-based fluoropolymer-copolymer (CAS number: 31175-20-9), titanium oxide or poly(1,1,2,2-tetrafluoroethylene) (CAS number: 9002-84-0).

According to an embodiment of the present invention, the at least one kind of proton-conductive ionomers 40 and/or at least one kind of hydrophobic particles 41 and/or an ionic liquid 42 may be added for example by spraying, ultrasonic spraying, decal-transferring, immersing, drop casting and/or filtering.

Finally, in a fourth step of the method according to the invention, a catalytically-active membrane or a membrane-electrode-assembly 20 may be formed by pressing and/or decal transferring the self-supporting nanoporous catalyst layer 4 on the substrate 5 with a membrane 10 or by pressing and/or decal transferring two self-supporting nanoporous catalyst layers 4 on their substrates 5 with the membrane 10, wherein the membrane 10 is preferably arranged between the two self-supporting nanoporous catalyst layers 4.

According to an embodiment of the present invention, the pressing and/or decal transferring may be carried out at a pressure between 1 bar and 75 bar and/or at a substrate temperature within 115° C. and 145° C., particularly for a time between 15 s and 600 s.

Optionally, in case a transfer substrate 51 is used, the transfer substrate 51 may be detached from the catalytically-active membrane 10 or the membrane-electrode-assembly 20 after pressing and/or decal transferring.

Figure 2:
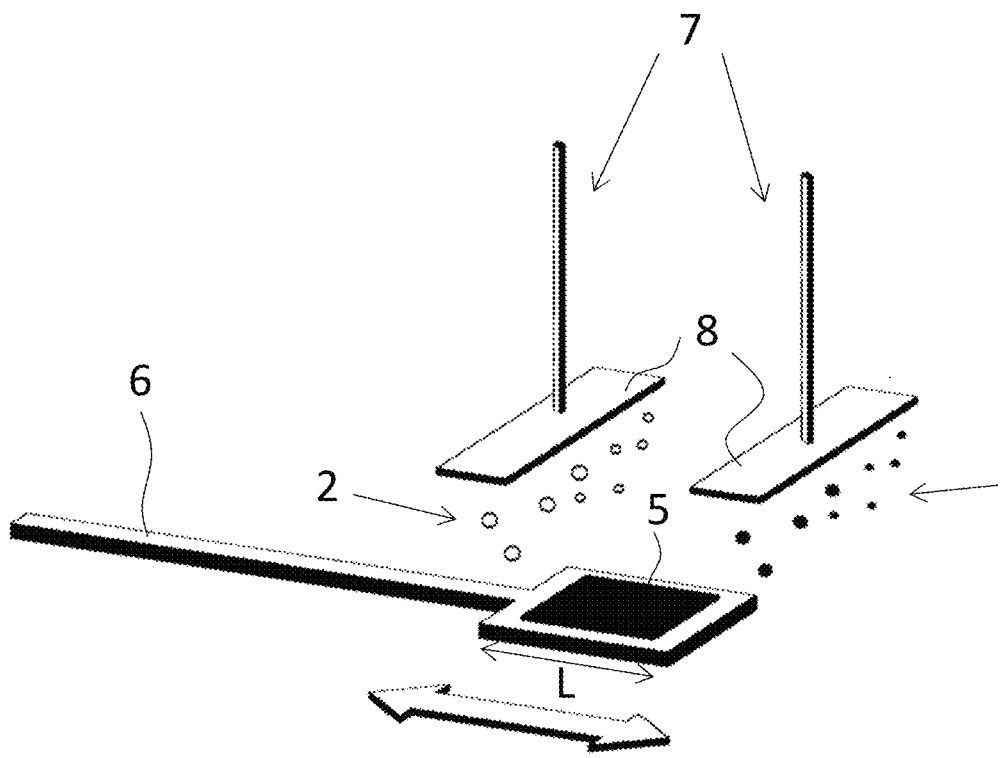
FIG. 2 shows an embodiment of the method according to the invention, wherein a base metal and a noble metal are deposited on a substrate, forming a heterogeneous layer that may be processed to a catalytically-active electrode.

FIG. 2 refers to step i) of the method according to the invention, wherein a heterogenous layer is formed on a substrate 5, the heterogeneous layer 3 comprising a base metal 1 and a noble metal 2.

To this end, the substrate 5 may be placed on a substrate holder 6.

According to the embodiment of the present invention, the deposition of the base metal 1 and/or the noble metal 2 may be performed by PVD. The PVD may particularly include sputtering, particularly (alternating) magnetron sputtering 7.

As shown in FIG. 2, the PVD may be directed from a sputtering target 8 comprising a rectangular target area to the substrate 5, particularly with a pressure between 2 Pa and 10 Pa, particularly by using a RF or a DC plasma source.

To cover large areas of the substrate 5, the substrate 5 may be moved back and forth relative to a resting point, particularly periodically in time, as indicated by an arrow. For example, a substrate 5 with a lateral dimension L, particularly a width or a length, may be moved back and forth by an offset of at least L/4 relative to the resting point.

Moving the substrate 5 in this manner, particularly in combination with the rectangular target area advantageously minimizes the required target material and is scalable to different sputtering sizes.

According to an embodiment of the present invention, the deposition of the base metal 1 and the noble metal 2 may be alternated at least three times. That is to say, that the deposition of the base metal 1 and the noble metal 2 is performed one after another in a series of cycles to achieve the desired loading in a specific layer thickness. Preferably, the weight ratio between the deposited base metal 1 and the deposited noble metal 2 may be between 0.5:1 and 20:1.

These parameters advantageously result in a highly heterogenous layer that may further be processed to a self-supporting nanoporous catalyst layer 4.

Figure 3:
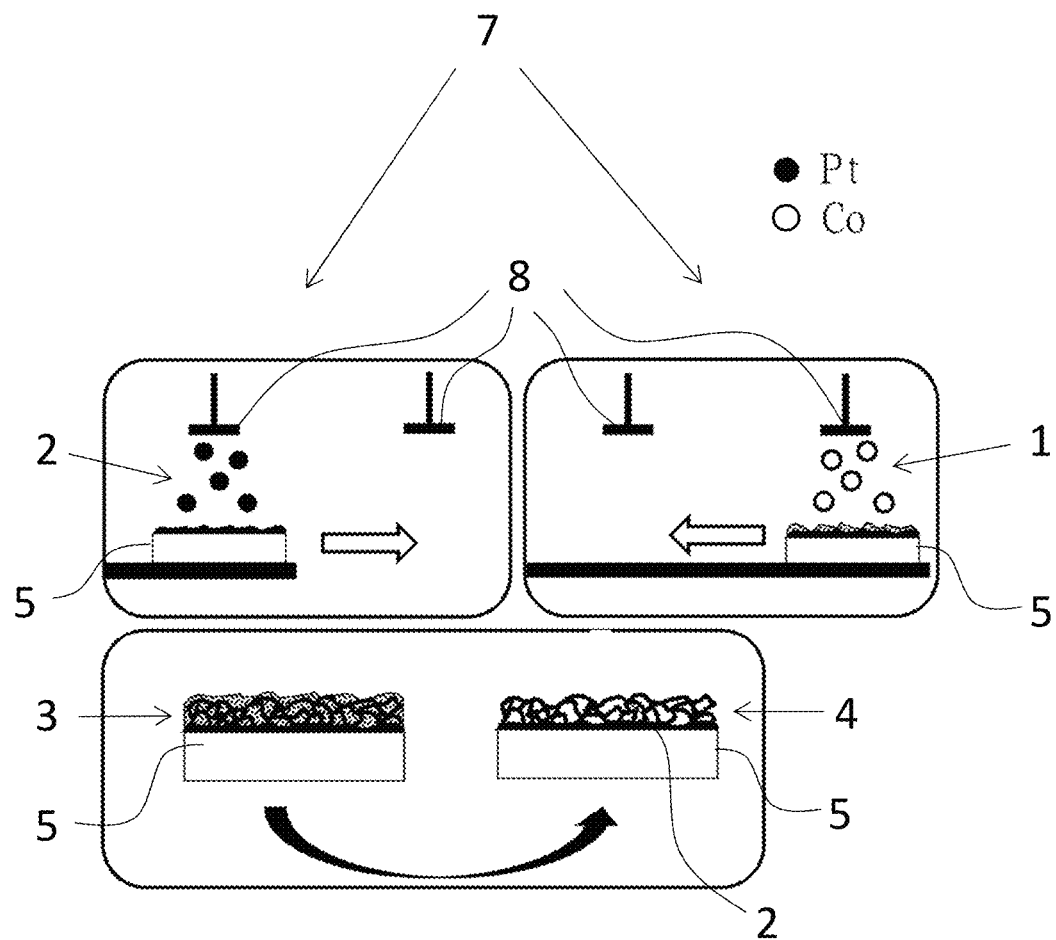
FIG. 3 shows an embodiment of the method according to the invention, wherein the base metal is leached out of the heterogeneous layer, forming a catalytically-active electrode.

FIG. 3 depicts an embodiment of the method according to the invention, particularly referring to steps i) and ii) of the method according to the invention.

In this embodiment, the base metal 1 and the noble metal 2 may be deposited on the substrate 5 placed on the substrate holder 6 by magnetron sputtering 7, wherein the substrate 5 placed on the substrate holder 6 is moved relative to the sputtering target 8. The deposition of the base metal 1 and the noble metal 2 may be alternated by moving the substrate 5 placed on the substrate holder 6 relative to the respective sputtering target 8 comprising the base metal 1 and the noble metal 2 and then starting the sputtering process.

The resulting heterogeneous layer 3 may further be processed to a self-supporting nanoporous catalyst layer 4 by leaching the base metal 1 out of the heterogeneous layer 3, such that a self-supporting nanoporous catalyst layer 4 comprising the noble metal 2 is formed.

FIG. 4 shows an embodiment of the method according to the invention, referring to the leaching of the base metal 1 out of the heterogeneous layer 3 as proposed by step ii) of the method according to the invention.

Preferably, the leaching is carried out in an electrolyte 35 arranged between a first leaching electrode 31 and a second leaching electrode 32, wherein the heterogeneous layer 3 and the first leaching electrode 31 are electrically connected and a leaching current is applied between the first and the second leaching electrode 31,32, such that the base metal 1 is leached out of the heterogenous layer 3. The heterogeneous layer 3 on the substrate 5, particularly on the transfer substrate 51 is preferably arranged within the electrolyte 35. An electrical potential within the electrolyte 35 may further be controlled by an optional third leaching electrode 33.

The electrolyte 35 may comprise an acid, for example at least one of the following: $HClO_4$, $H_2SO_4$, $HNO_3$. The electrolyte 35 may also comprise a base, for example at least one of the following: KOH or NaOH. The concentration of the acid or the base in the electrolyte 35 may for example be within 0.1 mol/l and 8 mol/l.

For the leaching process, the leaching current is applied preferably between the first leaching electrode 31 and the second leaching electrode. A third leaching electrode 33 may serve as a reference electrode arranged closer to the first leaching electrode 31 than to the second leaching electrode 32. As such, the third leaching electrode 33 may be configured to control the potential of the first electrode 31 and to allow a voltage measurement between the first and the third electrode 31,33. The third leaching electrode 33 may comprise a platinum wire in hydrogen atmosphere. Preferably, for the leaching process, the leaching current between the first and the second leaching electrode 31,32 may be controlled such that a potential difference between the first leaching electrode 31 and the third leaching electrode 33 corresponds to a predetermined voltage, preferably a voltage within −0.2 V and 1.5 V.

Preferably, the first leaching electrode 31 connected to the heterogeneous layer 3 may be kept at positive potential so as to avoid redepositing of base metal 1 on the resulting self-supporting nanoporous catalyst layer 4. The voltage between the first and the third reference electrode 31,33 and the leaching current between the first and the second electrode 31,32 may be constant or alternating in time, particularly alternating periodically in time.

To avoid cross-contamination of leached cations, the electrolyte 35 is preferably at least partially exchanged or comprises a flow during step ii).

According to an embodiment of the present invention, the leaching is performed at a temperature of the electrolyte 35 between 10° C. and 95° C.

Preferably, as shown in FIG. 4, the first, the second and the third leaching electrode 31,32,33 as well as the electrolyte 35 may be arranged at least partially within a leaching chamber 30.

The leaching chamber 30 may further comprise an inlet 34 and optionally an outlet (not shown) for conducting and controlling a flow of a non-reactive (inert) gas, particularly $N_2$ and/or Ar or a reactive gas, particularly $H_2$ and/or $O_2$ through the leaching chamber 30, so as to create desired electrochemical conditions in the leaching chamber 30.

The leaching chamber 30 may be configured such that the third leaching electrode 33, that may serve as a reference electrode, may be at least partially arranged within the electrolyte 35, so as to control the electrical potential within the electrolyte 35. The first and the second leaching electrode 31,32 may be arranged such that the electrolyte 35 is located between the first and the second leaching electrode 31,32. Particularly, the first leaching electrode 31, that is preferably connected to the heterogeneous layer 3, may be arranged on top, particularly floating on top of the electrolyte 35, as shown in FIG. 4. The second leaching electrode 32 may for example be arranged on a bottom of the leaching chamber 30. The inlet 34 and the outlet for the optional flow of the non-reactive or reactive gas may be arranged on top of the electrolyte 35, particularly on top of the first leaching electrode 31, such that the flow is directed over the electrolyte 35 and an upside of the first electrode 31 facing away from the electrolyte 35, so as to establish the desired electrochemical conditions in the leaching chamber 30.

Figure 5:
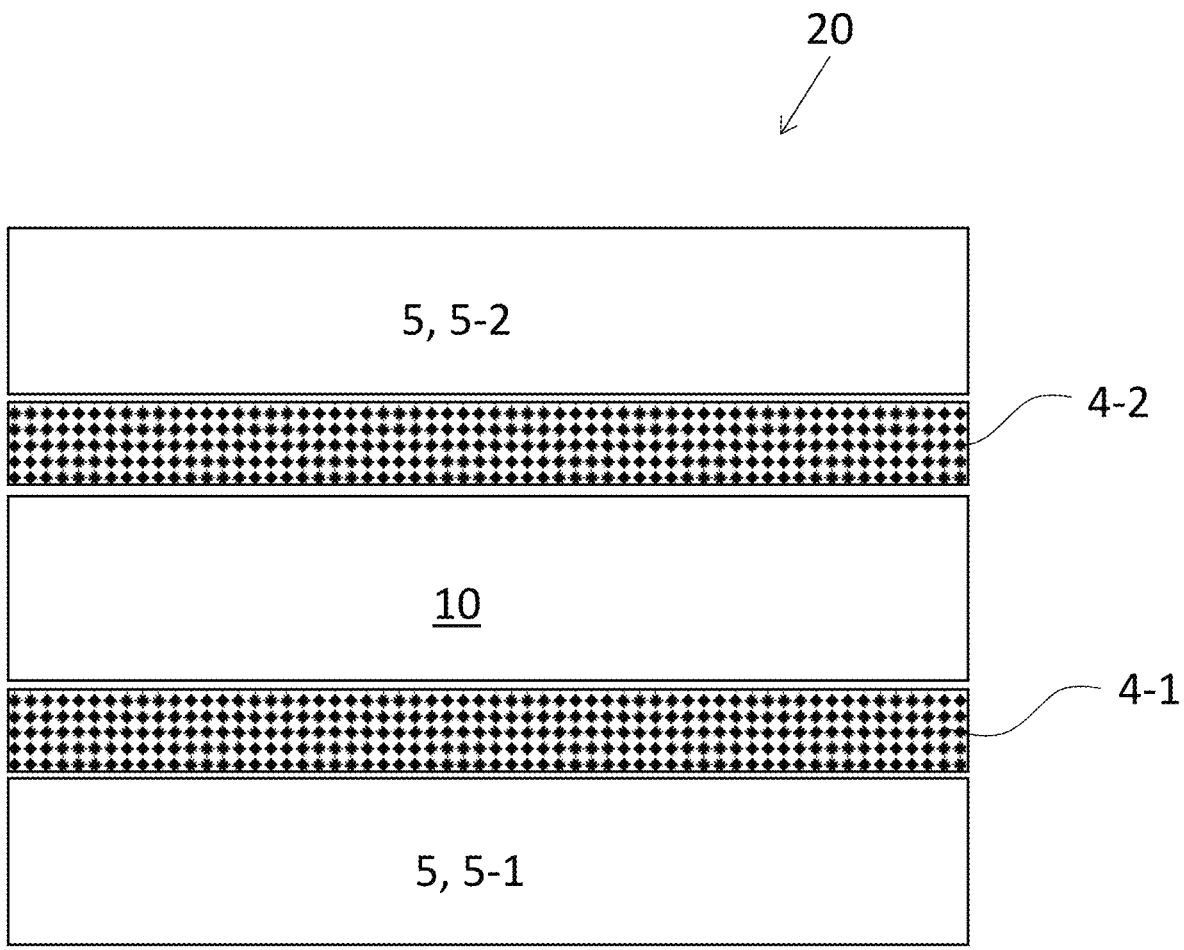
FIG. 5 shows a schematic cross-section through a membrane-electrode-assembly according to the invention.

In FIG. 5 a schematic cross-section through an embodiment of the membrane-electrode-assembly 20 according to the invention is shown. In this example, the membrane-electrode-assembly 20 comprises two nanoporous catalyst layers 4-1, 4-2 that are arranged between the membrane 10 and a respective first or second gas-permeable electrode layer 5-1, 5-2.

The first nanoporous catalyst layer 4-1 consists of a plurality of grains 100 (indicated by black spaces of the fill pattern of the corresponding box) that form the nanoporous catalyst layer 4-1. In between the grains 100, there are gaps 101 (white spaces of the fill pattern), that allows a comparably large surface area of each grain 100 accessible so that the catalyst compound comprised by the grains 100 is exposed to a great degree to the surroundings of the grains, as for example compared to a continuous or quasi continuous catalyst layer.

The assembly 20 in essence forms a stack that may be used in electrolyzers or fuel cells.

Figure 6:
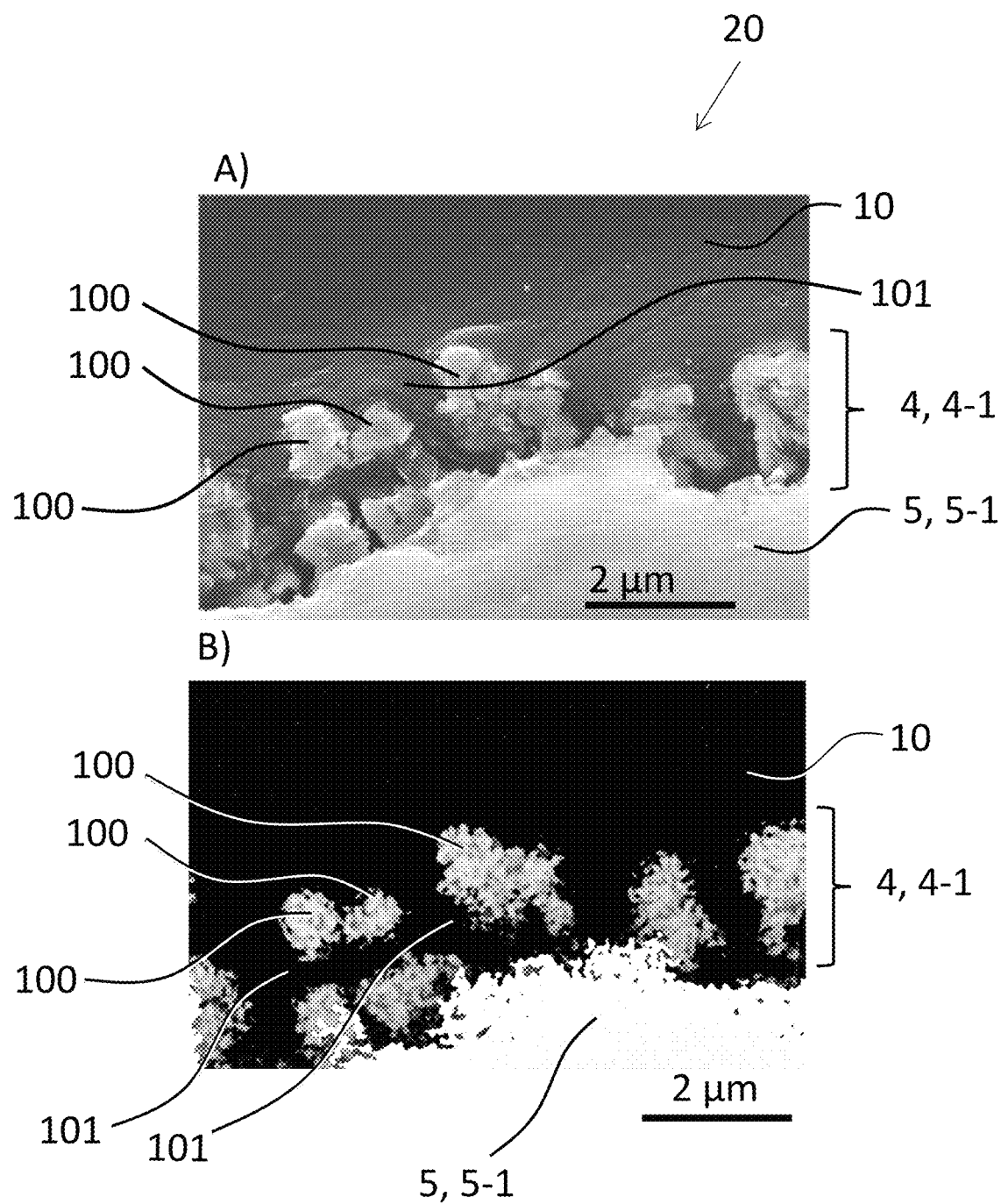
FIG. 6 shows SEM-recordings of a membrane-electrode-assembly according to the invention.

In FIG. 6 a scanning electron microscope (SEM) image of one embodiment of the assembly 20 is shown. The image is taken at a cross-section such that the layers of the assembly. Recording parameters are 15 kV acceleration energy for the electrons, at a 15.000× magnification. The recording was obtained at a working distance of 7.8 mm. A pixel size of the pixels in the image corresponds to 7 nm; a scale bar indicative of a length 2 μm is overlaid on the image.

In the upper panel A) the SEM recording is shown, wherein in the lower panel B) the same region is recorded showing a false-coloring indicative of the detected compounds.

As can be seen the first nanoporous catalyst layer 4-1 is formed by a plurality of grains 100 that are made of iridium in this example. Each grain 100 can be recognized as a separate entity or particle of the catalyst layer 4-1, even though the grains may be partially interconnected. An equivalent sphere diameter can be associated to the grains 100, that allow for a comparison and measure of the differing grain shapes. The gaps 101 extend and at least partially separate the grains 100 from each other allowing a comparably large surface area to be exposed to the surrounding of the grains 100. The gaps may be filled with membrane 10 compound.

An associated thickness of the catalyst layer is in the range of 2 μm, which is comparably smaller than layers known in the prior art [1], [2].

Figure 7:
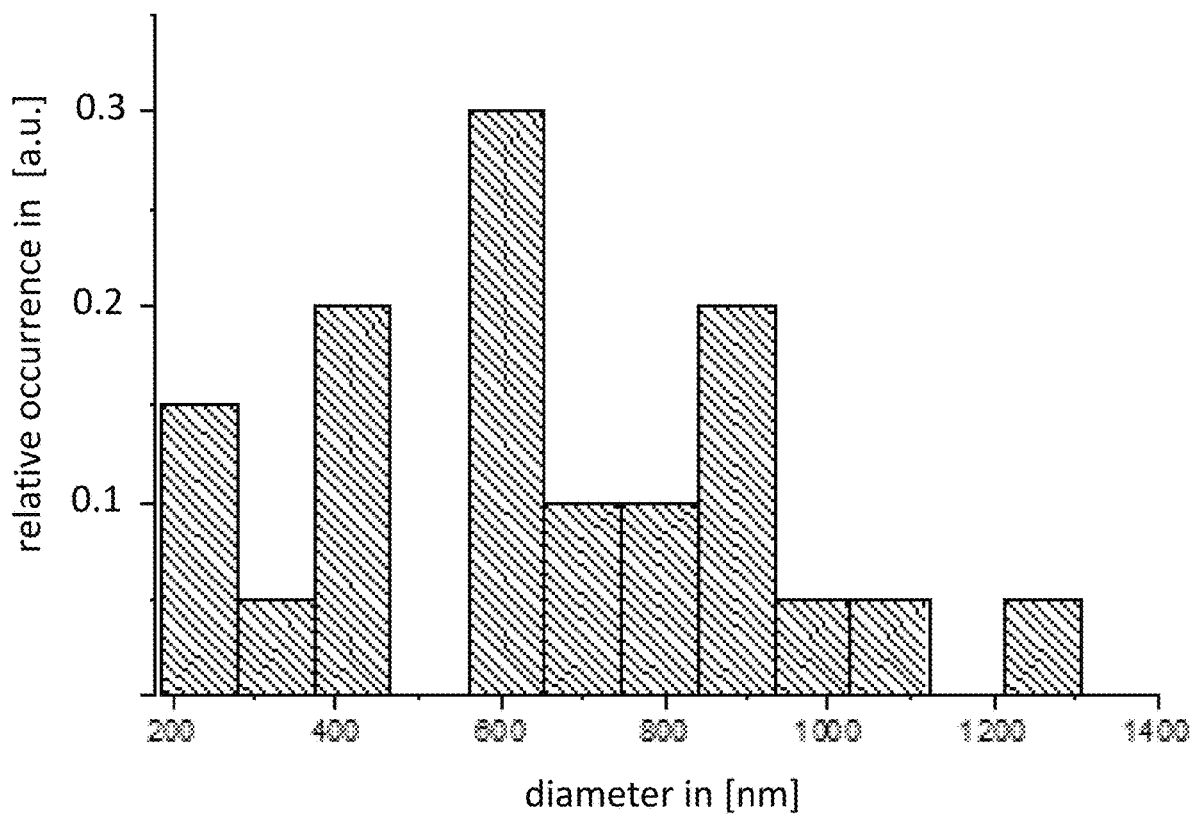
FIG. 7 shows a histogram of a size distribution of the grains on the catalyst layer.

In FIG. 7 a histogram of the relative occurrences of grain sizes from the determined equivalent spherical diameters of the grains is shown, demonstrating the heterogeneity of the grain size distribution as well as the granular structure of the catalyst layer. A median value of the grain size according to this histogram may be in the range of 450 nm to 750 nm, while a range of the grain diameters may extend approximately in the range of 50 nm to 1.300 nm.

REFERENCES

[1] Xinrong Zhang, Wei Zhang, Weijing Yang, Wen Liu, Fanqi Min, Samuel S. Mao, and Jingying Xie, "Catalyst-coated proton exchange membrane for hydrogen production with high pressure water electrolysis", Appl. Phys. Lett. 119, 123903 (2021) https://doi.org/10.1063/5.0060150

[2] Maximilian Bernt et al 2018 J. Electrochem. Soc. 165 F305 DOI 10.1149/2.0641805jes, "Analysis of Voltage Losses in PEM Water Electrolyzers with Low Platinum Group Metal Loadings"

We claim:

1. A membrane-electrode-assembly (20) for a proton exchange membrane (PEM) fuel cell or an electrolyzer comprising the following components:
a first gas-permeable electrode layer (5, 5-1),
a first self-supporting nanoporous catalyst layer (4, 4-1) comprising a noble metal (2),
a membrane (10),
wherein the first self-supporting nanoporous catalyst layer (4, 4-1) extends between the first gas-permeable electrode layer (5, 5-1) and the membrane (10), characterized in that the first self-supporting nanoporous catalyst layer (4, 4-1) is formed by a plurality of grains (100) of a first catalyst compound, wherein gaps (101) are formed in between the grains (100) such as to form an increased surface area of the first self-supporting nanoporous catalyst layer (4, 4-1) for enhancing catalytic reactions, and wherein a median value of an equivalent spherical diameter of the grains is in the range of 450 nm to 750 nm, while a range of the equivalent spherical diameters of the grains is in the range of 200 nm to 1,300 nm, wherein the assembly (20) is formed using a method for manufacturing a catalytically-active membrane-electrode-assembly (20) with one or more electrodes, the method comprising at least the steps of:
i) depositing a heterogenous layer (3) on a substrate (5), the heterogeneous layer (3) comprising a base metal (1) and a noble metal (2) heterogeneously distributed in the heterogenous layer (3), wherein the noble metal comprises a plurality of grains, wherein a median value of an equivalent spherical diameter of the grains is in the range of 450 nm to 750 nm, while a range of the equivalent spherical diameters of the grains is in the range of 200 nm to 1,300 nm;

ii) leaching of the base metal (1) out of the heterogeneous layer (3), such that a first self-supporting nanoporous catalyst layer (4) comprising the noble metal (2) is formed on the substrate (5);

iii) adding at least one kind of proton-conductive ionomers (40) and/or at least one kind of hydrophobic particles (41) and/or an ionic liquid (42) to the first self-supporting nanoporous catalyst layer (4); and iv) forming the catalytically-active membrane-electrode-assembly (20) by attaching the self-supporting nanoporous catalyst layer (4) to a first side of a membrane (10), such that a catalytically-active membrane-electrode-assembly (20) with one electrode is formed.

2. The membrane-electrode-assembly (20) according to claim 1, wherein the assembly further comprises a second self-supporting nanoporous catalyst layer (4, 4-2), arranged on a second gas-permeable electrode layer (5, 5-2) on a side of the membrane (10) facing away from the first self-supporting nanoporous catalyst layer (4, 4-1), such that the second self-supporting nanoporous catalyst layer (4, 4-2) extends between the second gas-permeable electrode layer (5, 5-1) and the membrane (10), wherein the second self-supporting nanoporous catalyst layer (4, 4-2) is formed by a plurality of grains comprising a second catalyst compound, wherein gaps are formed in between the grains such as to form an increased surface area of the second self-supporting nanoporous catalyst layer (4, 4-1) for enhancing catalytic reactions.

3. The membrane-electrode-assembly (20) according to claim 1, wherein a ratio of a volume comprising the gaps (101) to a volume comprising the grains (100) of the first and/or the second self-supporting nanoporous catalyst layer (4, 4-1, 4-2) is in the range of 0.3 to 5.

4. The membrane-electrode-assembly (20) according to claim 1, wherein the first catalyst compound comprises or is iridium.

5. The membrane-electrode-assembly (20) according to claim 1, wherein the first gas-permeable electrode layer (5-1) comprises or is titanium (5-1).

6. The membrane-electrode-assembly (20) according to claim 2, wherein the second catalyst compound comprises or is platinum.

7. The membrane-electrode-assembly (20) according to claim 2, wherein the second gas-permeable electrode layer (5-2) comprises or is carbon (5-1).

8. The membrane-electrode-assembly (20) according to claim 1, wherein the membrane (10) is a proton-permeable membrane configured to retain at least hydrogen, oxygen.

\* \* \* \* \*